United States Patent [19]
Sprunk

[11] Patent Number: 5,509,076
[45] Date of Patent: Apr. 16, 1996

[54] APPARATUS FOR SECURING THE INTEGRITY OF A FUNCTIONING SYSTEM

[75] Inventor: Eric Sprunk, Carlsbad, Calif.

[73] Assignee: General Instrument Corporation of Delaware, Chicago, Ill.

[21] Appl. No.: 237,002

[22] Filed: May 2, 1994

[51] Int. Cl.⁶ .................................................. H04L 9/00
[52] U.S. Cl. ................................... 380/25; 380/2; 380/4
[58] Field of Search ............................ 380/2, 4, 6, 23–25

[56] References Cited

U.S. PATENT DOCUMENTS 4,932,053  6/1990  Fruhauf et al. .............................. 380/4
4,972,469  11/1990  Saltwick et al. ............................ 380/2

Primary Examiner—Salvatore Cangialosi
Attorney, Agent, or Firm—Barry R. Lipsitz

[57] ABSTRACT

Apparatus is provided for securing the integrity of a functioning system. The apparatus comprises a primary device for performing a function having a first vulnerability and a secondary device having a second vulnerability which is identical to the first vulnerability of the primary device. The secondary device is adapted to secure the function performed by the primary device in response to activity breaching the second vulnerability.

17 Claims, 6 Drawing Sheets

APPARATUS FOR SECURING THE INTEGRITY OF A FUNCTIONING SYSTEM

BACKGROUND OF THE INVENTION

The present invention relates generally to apparatus for securing the integrity of a system, and more particularly to electronic apparatus having a primary device such as a secure microprocessor for performing a function and a secondary device adapted for simulating that function and securing the function of the primary device.

The pirating or unauthorized interception of one's property can be a substantial threat to, e.g., a producer of services. For example, the unauthorized receipt of transmitted television programming incurs a substantial cost in lost profits to a satellite television or cable television (CATV) company. To protect against the pirating of a transmitted digital signal, encrypting devices using encryption codes have been developed for digital encryption of the signal. However, pirates can sometimes break the encryption by, e.g., attacking the hardware which performs the encryption function.

One way that encryption hardware has been compromised by intruders is via high-speed clock pulsing attacks on very large scale integration (VLSI) microprocessor circuitry used by the encryptor. A certain common aspect of VLSI microprocessor circuitry has been suspected of being vulnerable to these high-speed attacks. This aspect is known as "precharge" and refers to a minimal-area circuit design technique that connects data busses and shared control lines inside a VLSI microprocessor. It is believed that high-speed clock pulsing affects the operation of this type of circuitry.

Precharge acts like a time-sliced wired-OR bus for data. During some initialization time period, the data line is forced to a logic state that is opposite to the data state put onto the line by the multiple drivers used. This logic state is usually a one, or high voltage level. Following this initialization or precharge period, one of many driving data sources is allowed to pull the line low if a zero is the data bit state to be placed on the bus. Of course, there is no need for a data source to drive a logic one onto the line if it is precharged high, since the line has already been initialized into that state.

One way to detect an intruder involves monitoring the behavior of the "primary" circuit to be protected, e.g., a microprocessor, during this precharge period. If the primary circuit should be at a particular state, e.g., high or low, and it is not, then an attack may be occurring. However, it is very difficult to detect errant behavior of a complex device such as a microprocessor without adding a tremendous amount of dedicated circuitry for this purpose.

Accordingly, it would be advantageous to provide a relatively non-complex means that is useful for detecting the errant behavior of a primary device. It would also be advantageous to provide a low-cost means for detecting errant behavior. It would further be advantageous to detect an intruder attempting to withdraw information contained in a device and, in response, to secure the information and thereby prevent its loss.

The present invention provides an apparatus having the aforementioned advantages. In particular, the apparatus of the present invention provides a "secondary" device which simulates the vulnerability associated with a function of a primary device. Upon a breach of the simulated vulnerability provided by the secondary device, the latter will secure the primary device. Thus, a relatively inexpensive and non-complex apparatus is provided for securing a complex functioning system.

SUMMARY OF THE INVENTION

In accordance with the present invention, apparatus is provided for securing the integrity of a functioning system. The apparatus comprises a primary device, e.g. a processor, for performing a function and has a first associated vulnerability. A secondary device is provided which has a second vulnerability that emulates (e.g., is virtually identical to) the first vulnerability of the primary device. The secondary device is adapted to secure the function performed by the primary device in response to activity breaching the second vulnerability.

The primary device may comprise a first circuit means having a first input means. In such an embodiment, the secondary device comprises second circuit means having second input means for receiving substantially similar input as that input to the first input means. The second circuit means also has an output connected to, e.g., a reset of the first circuit means for securing, or resetting, the first circuit means.

In a first illustrated embodiment, the first circuit means includes at least one circuit element adapted to be precharged to a first state via the first input means. The second circuit means is adapted to simulate the precharge to the first state via the second input means. The second circuit means further includes means for determining whether the simulated precharged state equals either a "normal" state or an "attack detected" state. The second circuit means secures the function performed by the first circuit means in response to a finding by the determining means that the simulated precharged state equals the attack detected state. For example, where the primary device includes a processor for decrypting a signal, the decryption codes used by the processor may be secured by erasing them.

In another embodiment, the vulnerability of the primary device involves the transfer of information into and out of a storage means. In this situation, the first circuit means comprises storage means and first transfer means for transferring the information processed by the function into and out of the storage means. To simulate this vulnerability, the second circuit means includes second transfer means for transferring a known value in response to the transfer of information by the first transfer means. Means are provided for verifying that the known value has been validly transferred. Additionally, the securing of the function would be accomplished by suspending the transfer of information to or from the primary device. Another possible way to secure the function would be to reset a register utilized by the function.

In another illustrated embodiment, the first circuit means comprises first means for addressing a memory and the second circuit means includes second means for addressing a memory using a relative jump. Also provided are means for verifying that a correct relative jump has been effected.

3

Figure 2:
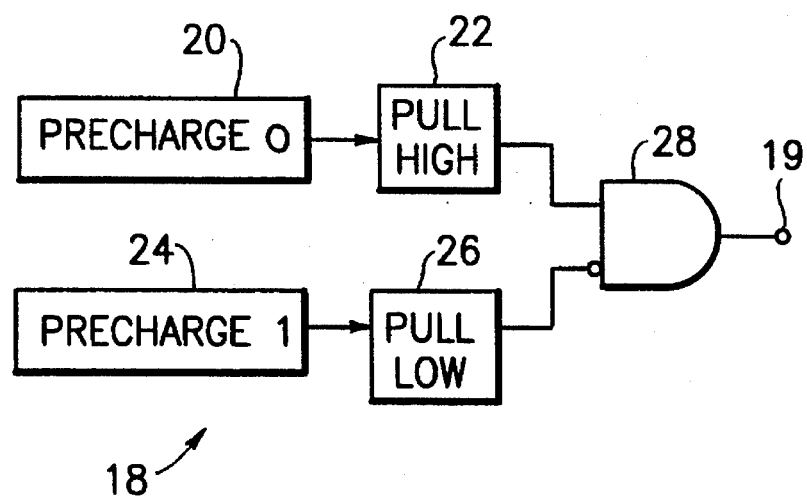
FIG. 2 is a block diagram of a simulator for use in the first embodiment of the present invention.
Figure 3:
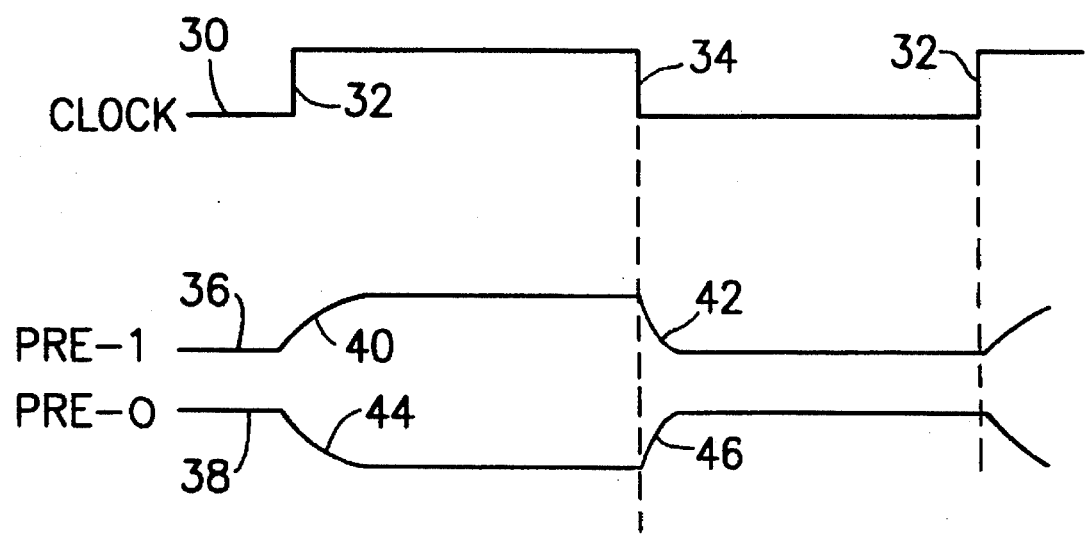
Figure 4:
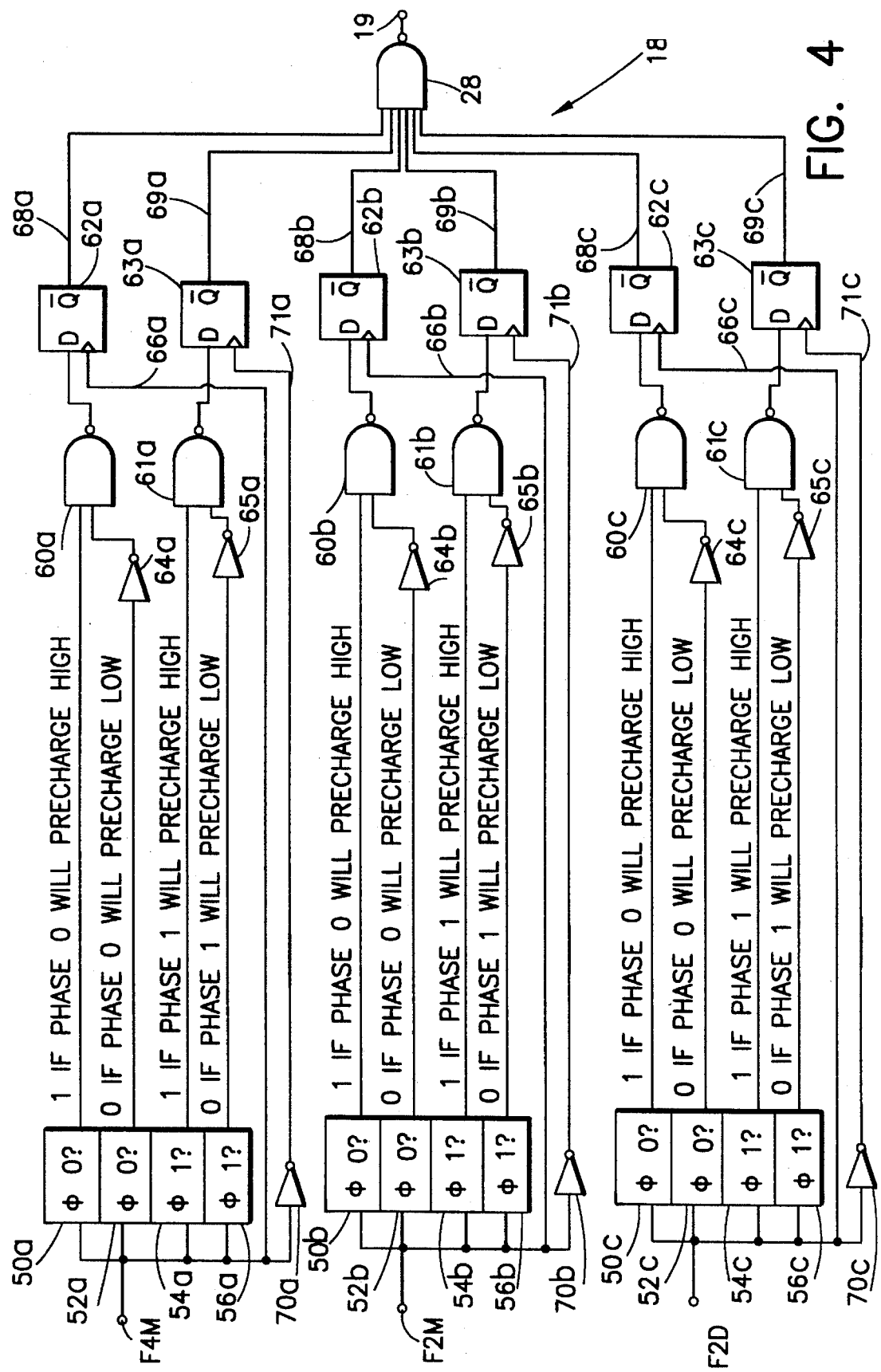
Figure 5:
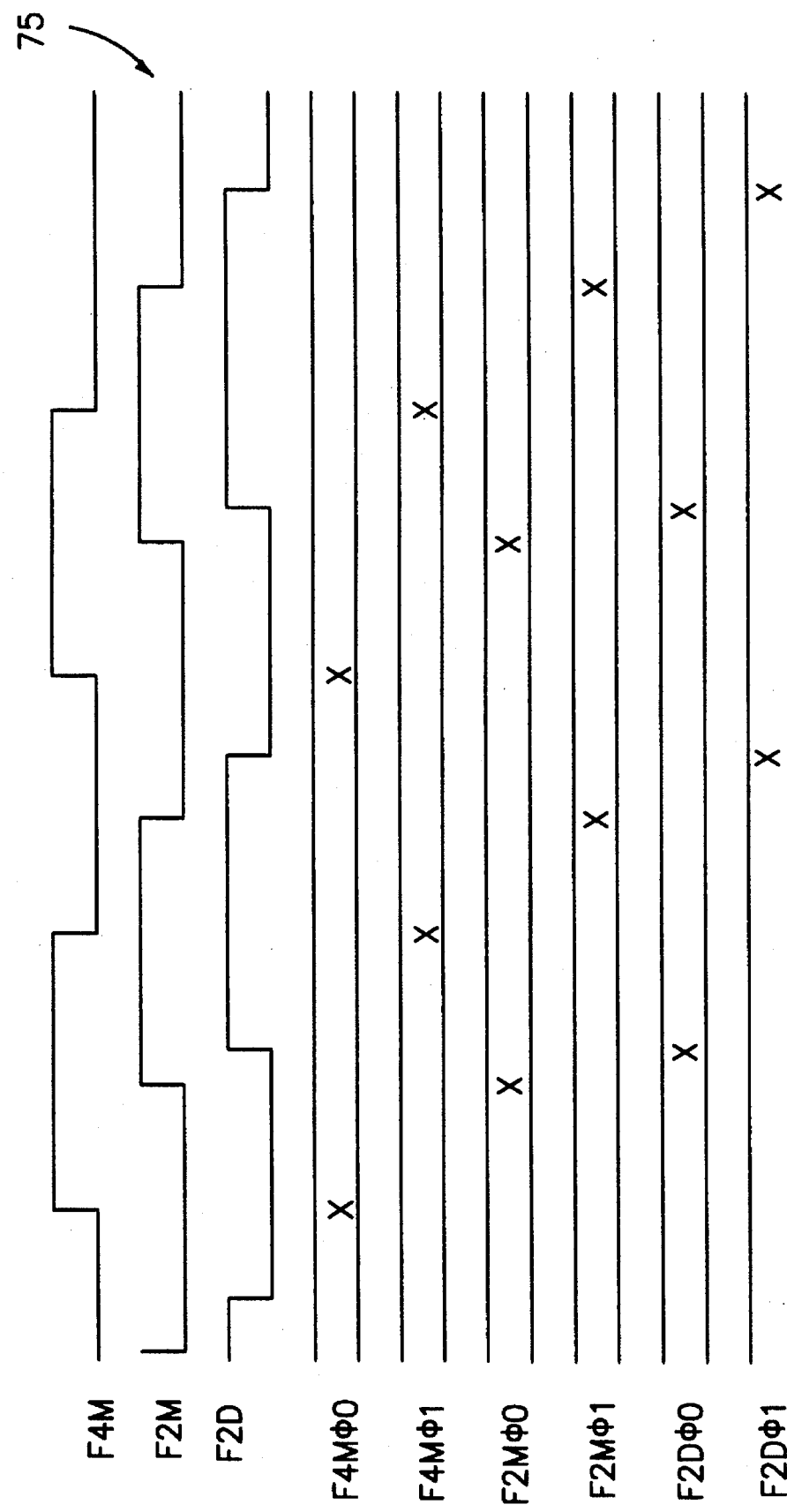
Figure 6:
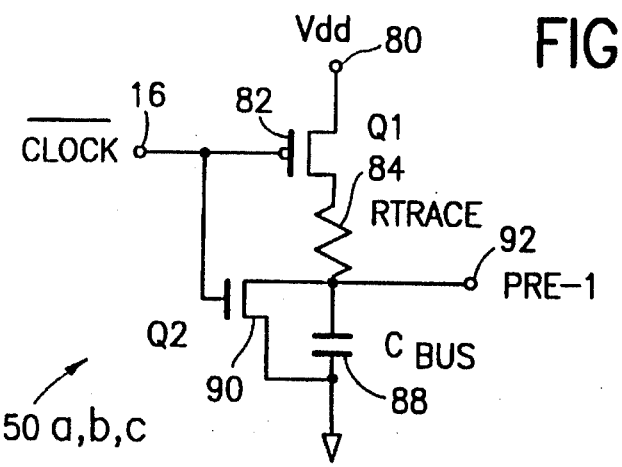
Figure 7:
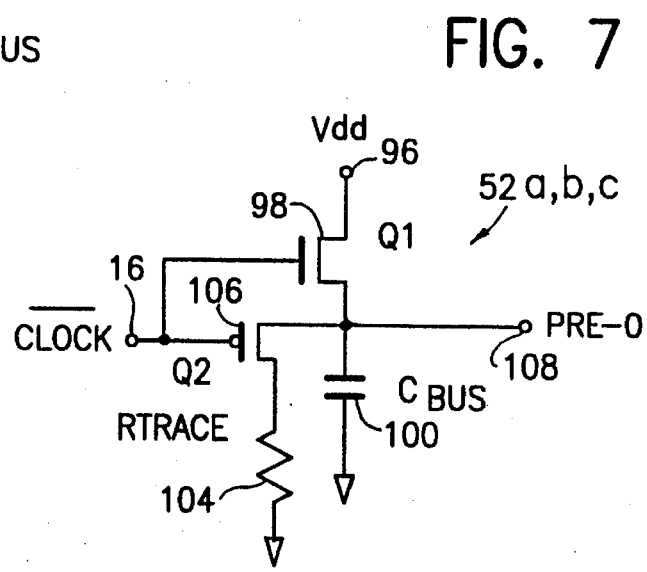
Figure 8:
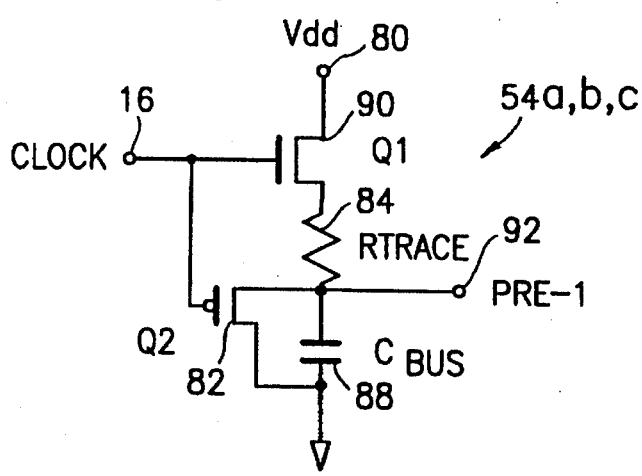
Figure 9:
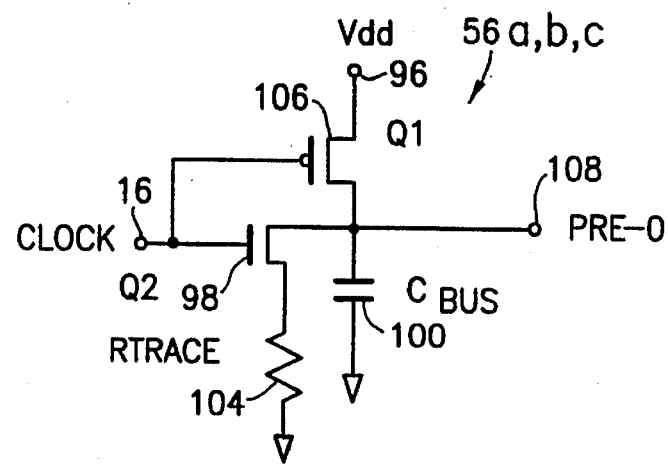
Figure 10:
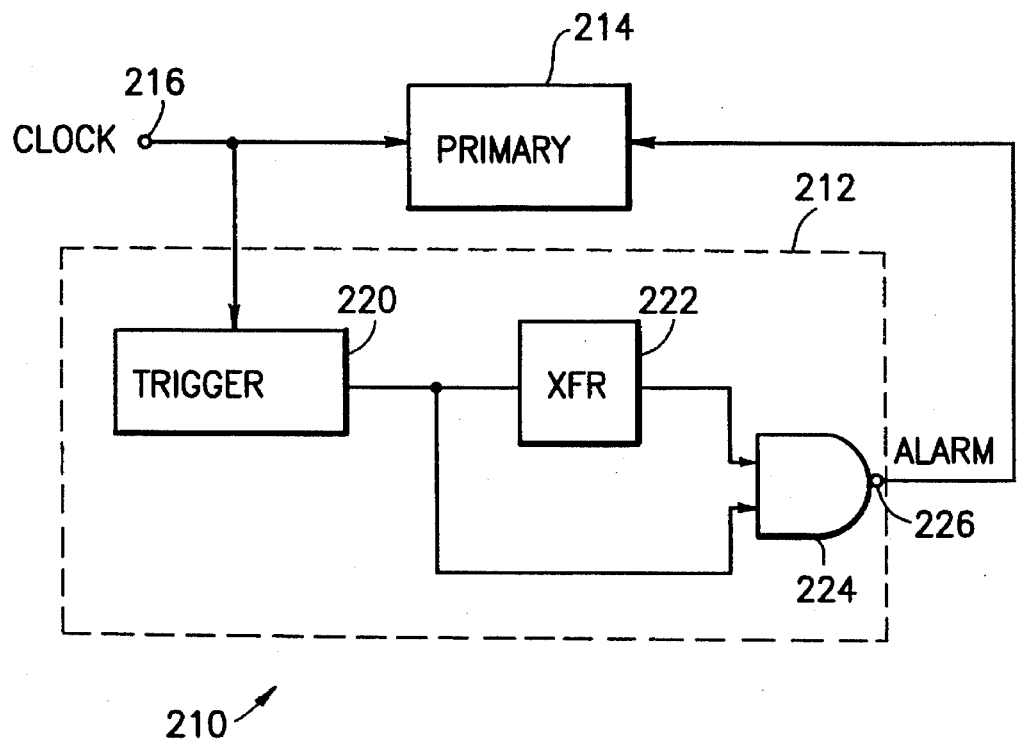
Figure 11:
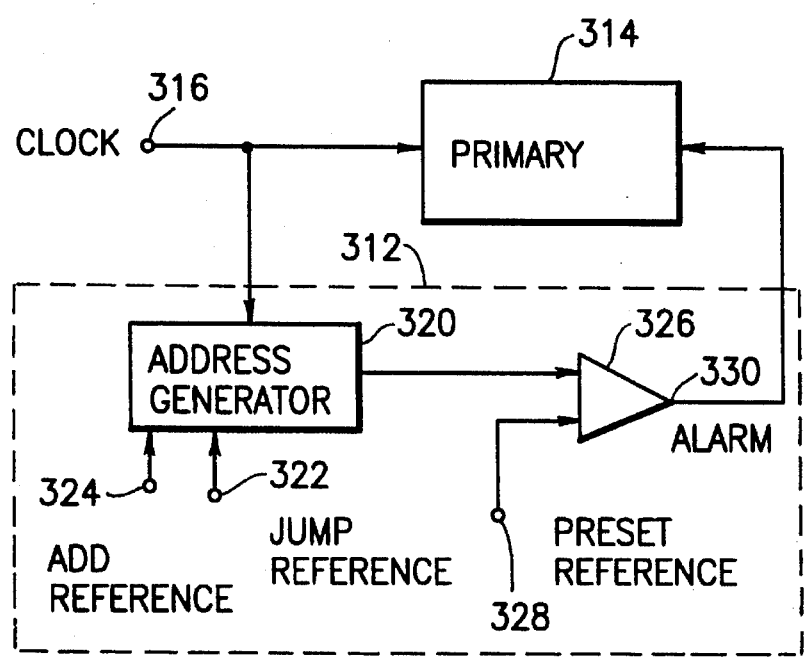

FIG. 3 is a timing diagram showing a clock cycle and resultant effect of the time constant during precharge of a primary device;

FIG. 4 is a more detailed block diagram of the device of FIG. 2;

FIG. 5 is a timing diagram for the device of FIG. 2;

FIG. 6 is a circuit diagram of a detector for simulating an electronic storage cell which is charged high from a clock pulse;

FIG. 7 is a circuit diagram of a detector for simulating an electronic storage cell which is charged high from an inversion of the clock pulse;

FIG. 8 is a circuit diagram of a detector for simulating an electronic storage cell which is charged low from a clock pulse;

FIG. 9 is a circuit diagram of a detector for simulating an electronic storage cell which is charged low from an inversion of the clock pulse;

FIG. 10 is a block diagram of another, embodiment of a device for securing a functioning system in accordance with the present invention; and FIG. 11 is a block diagram of yet another embodiment of a device for securing a functioning system in accordance with the present invention.

DETAILED DESCRIPTION OF THE INVENTION

Figure 1:
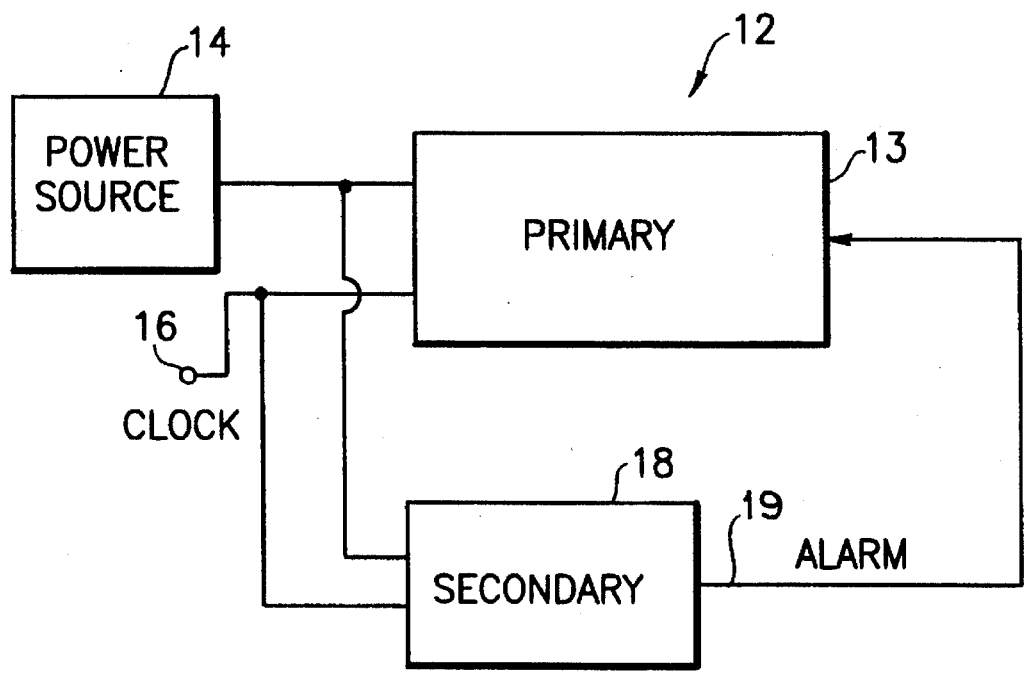
FIG. 1 is a block diagram of a first embodiment of a device for securing the integrity of a functioning system in accordance with the present invention.

FIG. 1 illustrates a first embodiment of an apparatus generally designated 10 for securing the integrity of a functioning primary device or system shown generally at 12. It will be appreciated that the primary system 12 may be any system which performs a function, such as an electronic circuit. It will also be appreciated that the function performed by the primary system 12 may vary widely, and is vulnerable to loss or interference either from inside or outside the primary system. The primary system 12 may comprise, for example, a secure microprocessor used in conjunction with the decryption of an encrypted signal.

The primary device 12 illustrated in FIG. 1 includes a processor 13 which is coupled to a suitable power source 14, and receives a clock signal from a clocking means via terminal 16. The clocking means as illustrated herein includes a plurality of different phases, and it will be appreciated that any suitable number of clocks and/or clocking phases may be employed depending on the needs of the primary system being secured.

In accordance with the present invention, the apparatus 10 comprises a secondary device or simulator 18 for securing the integrity of the processor 13. The simulator 18 has a vulnerability which emulates (and is preferably identical) to the vulnerability of the processor 13 and is adapted to secure the function performed by the processor in response to activities which breach the vulnerability of the simulator 18. To simulate the vulnerability of the processor 13, the simulator 18 receives input from the same sources as the processor 13. As illustrated herein, simulator 18 is coupled to the same power source 14 and receives the same clock signals via terminal 16 as the primary device. To secure the processor 13 in response to a breach of the vulnerability of the simulator 18, an "alarm" output 19 is provided from the simulator to the processor 13. The output 19 may be adapted, e.g., to erase any protected or secret information contained in the processor in response to a breach of the vulnerability of the simulator 18.

4

As discussed above, it is believed that high speed clock pulsing attacks can allow unauthorized parameters of the processor 13 to be ascertained. These attacks may be detectable during precharging of the processor 13. During such precharging, circuit elements of the processor 13 may be precharged to logic zero (or low) and then pulled to a logic one (or high) or may be precharged high and then pulled low. To make the simulator 18 vulnerable to the same precharge attacks as the processor 13, the simulator is provided with circuitry which responds identically to the same precharge conditions as the processor 13.

Referring now to FIG. 2, the simulator 18 is precharged simultaneously with the processor 13. The simulator 18 includes circuitry 20, described in more detail hereinafter, which is precharged to a low logic level (logic zero) and is then pulled high in response to appropriate data and clock pulses by circuitry 22, simulating the operation of equivalent circuitry in processor 13. The simulator 18 also includes circuitry 24, described hereinafter, which is precharged to a high logic level (logic one) and is then pulled low in response to appropriate data and clock pulses by circuitry 26, simulating the operation of equivalent circuitry in processor 13.

During precharge, providing no problems occur, the current state of the circuit elements of the processor should correspond to the "normal" precharge state for a given circuit element, as should any circuitry simulating the circuit element. In other words, elements which should be low throughout a given precharge clock cycle and which should subsequently change high should do so. Similarly, circuit elements which should be high throughout a given precharge clock cycle should remain high and should subsequently change to low only in response to appropriate data and clock pulses. If there is any disruption of the processor, such as by an attack or otherwise, the precharge state of the system will not be the "normal" state. This predictability of the precharge state of the circuit elements of the processor 13, and the identical predictability of the circuitry of the simulator 18, is used to detect an unauthorized intrusion into the processor 13. To achieve this, a gate 28 is provided for monitoring the output signals from the circuitry of the simulator 18. Upon the detection of an unexpected combination of signals, the gate will provide the aforementioned alarm output 19 for securing the processor 13.

As illustrated in FIG. 3, a clock has a waveform 30 which, it will be appreciated, includes a generally square shape and has a voltage level which increases at edges 32 and decreases at edges 34. To ensure that all the vulnerable precharged circuit elements of the processor 13 have been simulated, both precharging to high and precharging to low must be simulated. In addition, an inverse clock (which is not shown in FIG. 3) may exist for various of the processor precharge circuit elements, and thus a simulation of these circuit elements must also be provided. Further, to obtain the exact timing during high and low precharging, the simulator 18 must simulate the propagation and bus load timing of the processor 13. The bus load timing of the circuit elements during high and low precharging is illustrated by waveforms 36 and 38 of FIG. 3. Waveform 36 illustrates the voltage change in a precharge to high circuit. Similarly, waveform 38 illustrates the voltage change in a precharge to low circuit. As can be seen, waveform 36 ramps upwardly at 40 in response to a voltage increase at leading edge 32 of the clock. Waveform 36 ramps up relatively slowly because of the inherent resistance and capacitance in the precharging circuit element of the processor 13. To prepare for the next precharge cycle, the voltage level is rapidly discharged back to a low value at the trailing edge 34 of the clock, as shown at 42. In the precharge to zero case, represented by waveform 38, the voltage level ramps slowly to precharge at 44 and discharges rapidly at 46.

FIG. 4 illustrates an implementation of a simulator 18 in which each precharge state of the processor 13 is simulated, in order to ensure that the simulator will have all of the same vulnerability to precharge attacks as does primary processor 13. As illustrated herein, the processor 13 receives input from three separate phases (F4M, F2M and F2D) of a clock, generally designated 75 in FIG. 5. For each clock phase, there are four circuits 50, 52, 54, and 56 for simulating the vulnerability of the various precharge circuit elements of the processor 13. Circuit 50a simulates a precharging to high at the rising edge of clock F4M (phase 0) illustrated in FIG. 5. Circuit 52a simulates a precharging to low at phase 0 of clock. F4M. Circuit 54a simulates a precharging to high at the falling edge of clock F4M (phase 1). And, circuit 56a simulates a precharging to low at phase 1 of clock F4M. Similar simulations of the processor precharge circuits are provided by circuits 50b, 52b, 54b and 56b for clock F2M and circuits 50c, 52c, 54c and 56c for clock F2D.

Each of circuits 50a, b, c provides an output to a corresponding NAND gate 60a, b, c. The gates 60a, b, c each include an output which is, in turn, connected to a corresponding synchronous flip-flop 62a, b, c. The outputs of circuits 52a, b, c are inverted by respective inverters 64a, b, c which, in turn, are coupled to respective gates 60a, b, c. When in "normal" states, circuits 50a, b, c will output high levels to their respective gates 60a, b, c and circuits 52a, b, c, will output low levels, which are inverted to high, to respective gates 60a, b, c. The flip-flops 62a, b, c are triggered by a rising edge input from the respective clock (F4M, F2M, or F2D) via respective lines 66a, b, c. When triggered, each flip-flop 62 reads the output from its respective NAND gate 60 to determine if it is low, which it should be providing circuits 50 and 52 are in the "normal" state. Assuming the output of gate 60 is low, then the corresponding flip-flop 62 will generate an output signal via respective line 68a, b, c which indicates that both circuits 50 and 52 are in a "normal" state. Should the output of the gate 60 be high, then the output of the corresponding flip-flop 62 will be low, thereby indicating a problem and causing alarm output 19 to be enabled via NAND gate 28.

Circuits 54a, b, c and 56a, b, c operate similarly to circuits 50a, b, c and 52a, b, c respectively, for the phase 1 states of clocks F4M, F2M and F2D. Circuits 54 and 56 are connected to respective gates 61 which may be similar to gate 60. Since circuits 54 and 56 operate with an opposite clock phase, inverters 70a, b, c are provided for inverting the respective clock signals for input to the corresponding flip-flops 63a, b, c.

Each line 68a, b, c carrying output from the flip-flops 62a, b, c and each line 69a, b, c carrying output from the flip-flops 63a, b, c is connected to the NAND gate 28 which outputs an "alarm" at alarm output 19 when an abnormality is detected. When all twelve of the simulation circuits (50a, b, c, 52a, b, c, 54a, b, c, and 56a, b, c) are functioning in "normal" states, each of lines 68a, b, c and 69a, b, c will be high and the output of gate 28 will be low. However, if any simulation circuit is not in a "normal" state, for example because of a precharge attack, then one or more of the lines 68a, b, c or 69a, b, c will be low, thereby causing NAND gate 28 to enable the alarm output 19 which may, e.g. be connected to reset the processor 13.

FIG. 5 depicts the timing of each of the three clocks 75 (F4M, F2M and F2D) as seen at the processor 13 and at each of the precharge low and precharge high simulation circuits. Each X represents the clock edge used to validly sample the results of a precharge simulation circuit. Thus, for example, for the active low portion of clock F4M, valid samples can be taken at the rising edges thereof as illustrated at F4Mϕ0. For the active high portion of clock F4M, valid samples can be taken at the falling edges thereof as illustrated at F4Mϕ1.

Each of the circuits 50, 52, 54, and 56 include components (e.g., R-C networks) for matching the precharge timing of the processor 13. FIG. 6 depicts an embodiment that can be used for circuits 50, to simulate a circuit element of processor 13 that precharges high at clock phase 0. The circuit comprises a normally off, P-type metal oxide semiconductor (PMOS) transistor 82 (Q1) coupled to receive voltage Vdd via terminal 80. The gate of the transistor is connected to receive a corresponding clock signal ($\overline{\text{clock}}$) via terminal 16, and the drain is connected in series with one side of a resistor 84. The resistor 84 simulates the resistance of bus lines in the processor 13 and therefore may be small. The other side of the resistor 84 is connected to a capacitor 88, which simulates the cross-loading of the processor 13. A second transistor 90 (Q2) is provided for discharging the capacitor 88 when the clock signal at terminal 16 goes high. The charge on capacitor 88 provides an output signal at terminal 92 for input to a respective NAND gate 60, shown in FIG. 4.

To properly simulate a high precharge, the time to charge the capacitor 88 ($T_{CH}$) and the time to discharge the capacitor ($T_{DCH}$) are defined as follows:

$$T_{CH} = R_{TRACE} \times C_{BUS}$$

$$T_{DCH} = R_{Q2} \times C_{BUS}$$

where:

$$T_{DCH} \ll T_{CH}.$$

It would be advantageous for $T_{CH}$ to be approximately equal to one-half of a clock phase. This will ensure that attacks by intruders using high speed clocking pulses which are less than one-half of a clock phase have a maximum detrimental effect on the simulation circuit 50, and thus are easily detected. To provide for proper simulation, the capacitor 88 must be cleared of charge before being recharged, and thus $T_{DCH} \ll T_{CH}$.

In operation, transistor 82 of FIG. 6 turns "on" when the clock input via terminal 16 goes low. At this time, transistor 90 remains "off." This causes the capacitor 88 to be charged via Vdd. When the clock goes high, transistor 82 turns "off" and transistor 90 turns "on", thereby discharging the capacitor 88 in preparation for the next low cycle of the clock. If one were to measure the voltage change at terminal 92, it would resemble that of waveform 36 illustrated in FIG. 3.

An example of circuits 52a, b, c, illustrated in FIG. 7, simulates circuit elements of the processor 13 which are precharged low during clock phase 0. Circuit 52 includes a normally off, N-type metal oxide semiconductor (NMOS) transistor 98 (Q1), the gate of which is connected to receive a clock signal via input terminal 16. The drain of transistor 98 is coupled to a capacitor 100. A resistor 104 is also coupled to the drain via a PMOS transistor 106. The capacitor 100 and the resistor 104 are equivalent to capacitor 88 and resistor 84 (FIG. 6), respectively, of circuit 50. The charge (or lack thereof) on capacitor 100 provides an output signal at terminal 108 for input to a respective NAND gate 60, shown in FIG. 4.

The time parameters of circuit 52 are as follows:

$$T_{DCH} = C_{BUS} \times R_{TRACE}$$

$$T_{CH} = R_{Q1} \times C_{BUS}$$

where:

$$T_{CH} \ll T_{DCH}$$

In operation, transistor 98 turns "on" when the clock goes high and thereby quickly charges the capacitor 100 while transistor 106 remains "off". When the clock goes low, transistor 106 turns "on", thereby allowing capacitor 100 to discharge through resistor 104.

An example of circuit 54 is illustrated in FIG. 8. This circuit simulates elements of the processor 13 which are precharged high during clock phase 1. The structure of circuit 54 is similar to that of circuit 50, a difference being in compensating for the fact that the clock is 180 degrees out of phase from the clock of circuit 50. To compensate for this phase difference, transistors 90 and 82 are switched in position, thereby ensuring that the capacitor 88 is charged and discharged in both circuits 50 and 54 at the same time.

Circuit 56, illustrated in FIG. 9, simulates elements of the processor 13 which are precharged low during clock phase 1. The structure of circuit 56 is similar to that of circuit 52, with a difference being in compensating for the fact that the clock is 180 degrees out of phase from the clock of circuit 52. To compensate for this phase difference, transistors 98 and 106 interchanged.

FIG. 10 illustrates a second embodiment of a device for securing a functioning system. As with the first embodiment illustrated in FIG. 1, the device 210 of FIG. 10 includes a secondary device or simulator 212 that has the same vulnerability to attack as a primary device 214. In this embodiment, the vulnerability of the primary device 214, simulated by secondary circuit 212, is the transfer of information into and out of a storage means of the primary device. To provide this vulnerability, the simulator 212 includes means for passing a fixed value from a first storage means to a second storage means in synchronization with, and each time, information is transferred into and out of the storage means of the primary device 214.

In accordance with the invention, the secondary device 212 receives the same clock(s) as primary device 214 via terminal 216, which may be similar to the clocks described above in connection with the first embodiment. The simulator 212 includes a trigger 220 which receives the clock. The trigger 220 outputs a pulse that is received both at a transfer emulator 222, for simulating the transfer of information into and out of storage within the primary device 214, and at a gate (e.g., NAND gate) 224. One way to simulate the transfer into and out of the primary device storage means is to transfer a fixed value. If the value transferred equals the fixed value input to the transfer means, then a valid transfer has occurred. Gate 224 provides an alarm output 226, which is enabled upon an invalid transfer of a fixed value through the emulator 222. In other words, if the value before and after transfer emulator 222 is not the same, as detected by gate 224, some error has occurred. The alarm output controls the function of the primary device 214, which, e.g., may be a secure processor for decoding an encrypted digital signal. When enabled, the alarm is adapted, for example, to suspend the transfer of information to or from the primary device.

FIG. 11 depicts yet another embodiment of the present invention for securing the integrity of an address scheme of a functioning system. A secondary device or simulator 312 is provided which is adapted to emulate the vulnerability to attack of a primary device 314. The simulator 312 emulates the function of a relative jump in primary device 314, and is connected to receive the same clock pulses which are provided to the primary device 314 via terminal 316. An address generator 320 is provided for emulating an address generator of the primary device 314. The address generator 320 receives input from a jump reference 322 and an add reference 324, and provides output to a comparator 326. The comparator 326 is also connected to a reference at terminal 328, which is preset to equal the add reference plus the jump reference. If the reference input via terminal 328 and the value output from address generator 320 are not the same, an alarm is output to primary device 314 via line 330. The alarm is adapted to secure the function of the primary device 314 upon detecting that the output of the address generator 320 is not equal to the reference 328.

It should now be appreciated that the present invention provides various means for securing an electronic device. The first illustrated embodiment discloses a VLSI hardware attack detector for use in secure microprocessors. This detector may, e.g., be used in conjunction with a smart card that provides a security function. It is intended to detect an intruder's activities and allow activation of attack response circuitry to protect the secure data within the microprocessor.

It is very difficult to detect errant behavior of a complex device such as a microprocessor without adding a tremendous amount of circuitry dedicated to this purpose. The essence of the present invention is to avoid such large circuitry in favor of a much smaller circuit that simulates the vulnerabilities of the complex microprocessor, in a more simply monitorable fashion. The monitor circuit has vulnerabilities that are preferably identical to the secure microprocessor it is protecting, so that any attacks on the processor will also result in a detectable attack on the smaller circuit.

The attack detector concept of the present invention can be extended as new aspects of processor function come under suspicion as attack targets. Should some new aspect of processor function become a probable vulnerability, then the detector can be expanded with, e.g., circuitry containing the same suspect vulnerability. The attack detector is essentially a vulnerability simulator, and can be added to with any new vulnerabilities that are discovered.

In the case of the smart card, a microprocessor is the core element, and an attack on the precharge functions thereof is the suspected vulnerability. A microprocessor for a typical smart card device requires one or more clock inputs, all operating at the same frequency but with different phases. Each one of these clocks must have the operation of any precharged nodes within the microprocessor simulated in the precharge attack detector ("PAD").

Without extensive analysis of the microprocessor, it is not easy to identify all locations where some form of precharge is used. The PAD of the first illustrated embodiment was therefore designed to detect all possible implementations, of which there are only a few. Precharge can only operate in a "precharge to 1" or "precharge to 0" mode, where this process takes place either on the 0 or 1 state of a given clock phase. Each clock phase therefore requires that four simple conditions be detected, where these cover the transfer of a single bit via each of the above mechanisms. Since there are three clock phases in total, there are twelve total elements in the PAD, where the failure of any one bit's transfer denotes the occurrence of interference presumed to be an attack.

The following table is an example of a PAD for one of the three clock phases-used by the microprocessor:

| Clock Signal State | Direction of Pre-Charge | Sample Clock Edge | Normal State | Attack Detected State |
|---|---|---|---|---|
| Low or 0 | 0 to $V_{dd}$ | Rising | 1 | 0 |
| Low or 0 | $V_{dd}$ to 0 | Rising | 0 | 1 |
| High or 1 | 0 to $V_{dd}$ | Falling | 1 | 0 |
| High or 1 | $V_{dd}$ to 0 | Falling | 0 | 1 |

In the second illustrated embodiment, the vulnerability of the primary device which is simulated involves the transfer of information into and out of a storage means. This vulnerability in the primary device is simulated by the transfer of a fixed value in the secondary device. By determining whether or not the fixed value has been correctly transferred, the function of the primary device can be secured.

In the last illustrated embodiment, the vulnerability of the primary device which is simulated is the use of a relative jump in an addressing scheme. An address generator is provided for combining jump and add references which are output to a comparator. The comparator compares the output of the address generator with a fixed reference to determine if they are equal. If the comparator determines that the two are unequal, the comparator will output an alarm signal for use in securing the primary device.

Although the invention has been described in connection with several specific embodiments, those skilled in the art will appreciate that numerous adaptations and modifications may be made thereto without departing from the spirit and scope thereof as set forth in the claims.

What is claimed is:

1. Apparatus for securing the integrity of a functioning system, comprising:
   a primary device for performing a function, said primary device having a first vulnerability, said first vulnerability including susceptibility to an unauthorized change of a condition of said primary device; and
   a secondary device having a second vulnerability which emulates said first vulnerability of said primary device, said secondary device being adapted to secure said function performed by said primary device in response to activity breaching said second vulnerability.

2. The apparatus of claim 1 wherein:
   said primary device comprises a first circuit having a first input; and
   said secondary device comprises a second circuit having a second input for receiving substantially similar input as that input to said first input, said second circuit also having an output connected to said first circuit for securing said first circuit.

3. The apparatus of claim 2 wherein:
   said first circuit comprises at least one circuit element adapted to be precharged to a first state via said first input; and
   said second circuit is adapted to simulate said precharge to said first state via said second input.

4. The apparatus of claim 3 wherein:
   said second circuit further comprises means for determining whether said simulated precharged state equals at least one of a normal state and an attack detected state; and said function is secured in response to a finding by said determining means that said simulated precharged state equals said attack detected state.

5. The apparatus of claim 1 wherein said function is secured by erasing information required by said function.

6. The apparatus of claim 2 wherein:
   said first circuit comprises storage means and first transfer means for transferring information processed by said function into and out of said storage means; and
   said second circuit comprises:
      second transfer means for transferring a known value in response to the transfer of said information by said first transfer means; and
      means for verifying that said known value has been validly transferred.

7. The apparatus of claim 6 wherein:
   said securing of said function is accomplished by suspending the transfer of information to or from said primary device.

8. The apparatus of claim 1 wherein:
   said securing of said function is accomplished by resetting a register utilized by said function.

9. The apparatus of claim 2 wherein:
   said first circuit comprises first means for addressing a memory; and
   said second circuit comprises:
      second means for addressing a memory using a relative jump; and
      means for verifying that a correct relative jump has been effected.

10. Apparatus for maintaining the integrity of an electronic device, comprising:
   a primary component having first associated circuitry for processing information that is vulnerable to unauthorized manipulation, where said unauthorized manipulation causes a change in a condition of said primary device; and
   a secondary component having second associated circuitry which simulates the vulnerability of the first associated circuitry, said secondary component being adapted to render said information unmanipulable upon determining that said vulnerability is under attack.

11. Apparatus in accordance with claim 10 wherein said primary component is a secure microprocessor.

12. Apparatus in accordance with claim 11 wherein said electronic device is a smart card.

13. The apparatus of claim 2, wherein said first input is coupled to a clock signal.

14. The apparatus of claim 1, wherein said function includes decoding encrypted digital data.

15. The apparatus of claim 2 wherein said first circuit comprises a microprocessor.

16. The apparatus of claim 1 wherein said unauthorized change comprises a change of a logical state of said primary device.

17. The apparatus of claim 16 wherein said secondary device protects said primary device against a high-speed clock pulsing attack.

* * * * *